(12) United States Patent
Kwon et al.

(10) Patent No.: US 6,335,900 B1
(45) Date of Patent: Jan. 1, 2002

(54) METHOD AND APPARATUS FOR SELECTABLE WORDLINE BOOSTING IN A MEMORY DEVICE

(75) Inventors: Ohsang Kwon; Hung Cai Ngo, both of Austin; Kevin John Nowka, Round Rock, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/734,226

(22) Filed: Dec. 12, 2000

(51) Int. Cl.[7] .................................................. G11C 8/00

(52) U.S. Cl. ............................. 365/230.06; 365/189.11; 365/189.07

(58) Field of Search ....................... 365/230.06, 189.11, 365/189.07, 189.09

(56) References Cited

U.S. PATENT DOCUMENTS

| 5,499,209 | A | * | 3/1996 | Oowaki et al. | ......... | 365/189.11 |
| 5,659,265 | A | * | 8/1997 | Ludwig et al. | ............. | 327/530 |
| 5,841,706 | A | * | 11/1998 | Umezaki et al. | ....... | 365/189.11 |
| 6,141,262 | A | * | 10/2000 | Sudo | ...................... | 365/189.09 |
| 6,229,753 | B1 | * | 5/2001 | Kono et al. | ............ | 365/189.11 |

* cited by examiner

Primary Examiner—Huan Hoang
(74) Attorney, Agent, or Firm—Casimer K. Salys; Bracewell & Patterson, L.L.P.

(57) ABSTRACT

A method and apparatus for selectable word line boosting in a memory device provides operating of the memory device over wide power supply ranges. A voltage reference and a comparator determine whether or not the power supply voltage has dropped below the range in which word line boosting is not required. If the power supply voltage has dropped, word line boosting is enabled, improving the noise margin and access time of the memory when operating at lower voltages.

11 Claims, 3 Drawing Sheets

METHOD AND APPARATUS FOR SELECTABLE WORDLINE BOOSTING IN A MEMORY DEVICE

BACKGROUND OF THE INVENTION

1. Technical Field

The present invention relates generally to memory circuits, and more particularly, to static and dynamic memories operable over wide power supply ranges.

2. Description of the Related Art

Static random access memory circuits (SRAMs) and dynamic random access memory circuits (DRAMs) require high densities and minimal read/write circuit architectures. To support minimal architectures, word line access circuits are shared in a wired-OR fashion. A storage cell is accessed by pre-charging a row word line wire and enabling a selected column gating transistor to read the value from the cell.

Use of memory circuits in battery-operated and other low voltage devices make it desirable to operate the memory circuits at as low a voltage as possible. Reading reliable results from a dynamic memory operating at a low power supply voltage is complicated by the large capacitance of the word lines and the threshold drop produced by the gating transistor. Low power supply voltages reduce the speed of the memory and at very low voltages, the reliability of the values read out. To solve this problem, memory circuits having a bootstrapped boost voltage applied to the word lines have been developed. The row word line is charged to a voltage higher than the power supply rail prior to accessing the memory location by switching on the column gating transistor.

While boost circuits provide reliable memory operation at low voltages, at high voltages, the access circuitry is over-stressed, limiting the upper end of the power supply operating range of memory device. Boosting also increases the power consumption of a memory. At high supply voltages, the power dissipation can exceed tolerable levels.

In light of the foregoing, it would be desirable to provide a method and apparatus for operating a memory device over a wide power supply range.

SUMMARY OF THE INVENTION

The objective of operating a memory device over a wide power supply range is accomplished in a method and apparatus for selectable word line boosting in a memory device. The memory device incorporates a word line access circuit having a selectable boost. A voltage comparator is coupled to the word line access circuit to enable boosting if a power supply voltage is less than a threshold voltage.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF AN ILLUSTRATIVE EMBODIMENT

Figure 1:
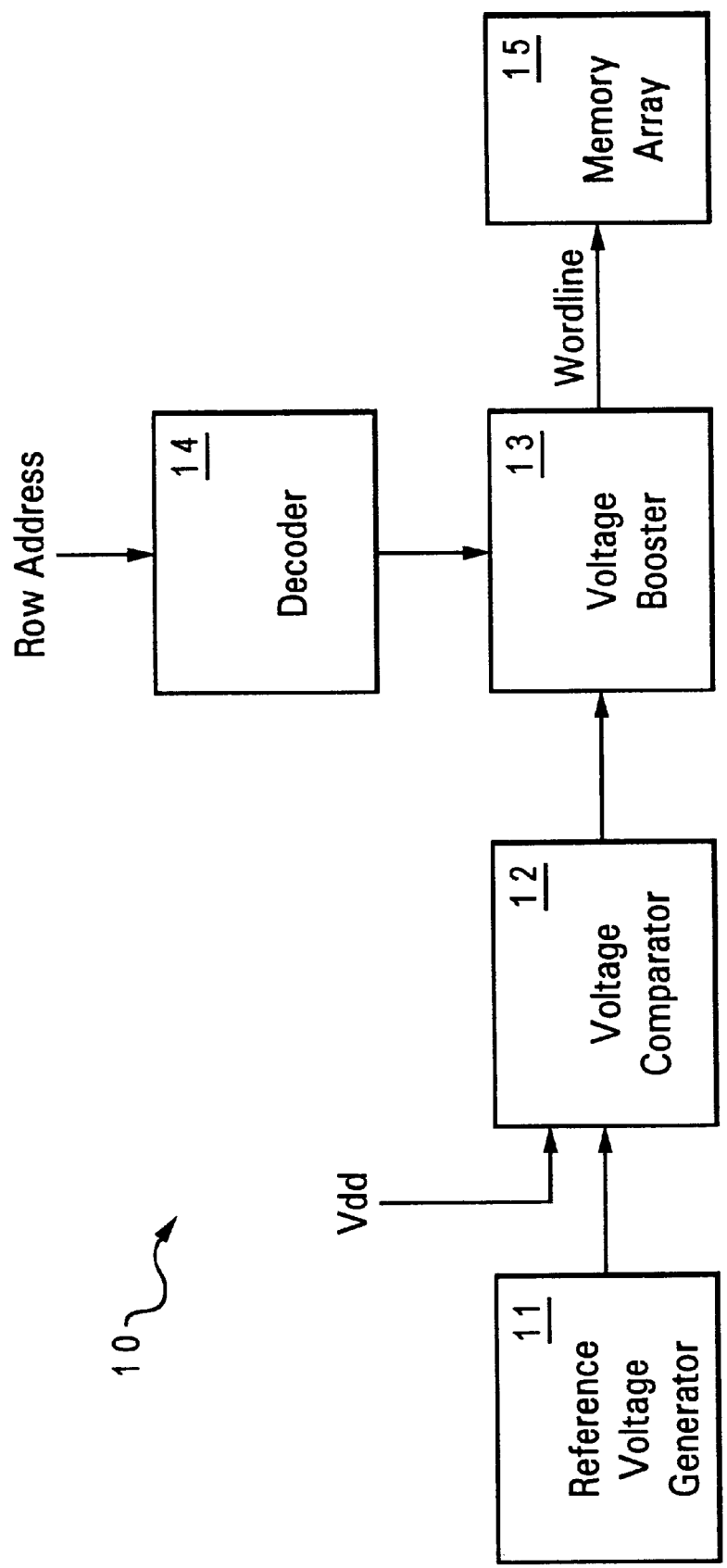
FIG. 1 is a block diagram of a memory drive circuit in accordance with a preferred embodiment of the invention.

With reference now to the figures, and in particular with reference to FIG. 1, there is depicted a block diagram of a memory drive circuit 10 in accordance with a preferred embodiment of the invention. A reference voltage generator 11 produces a reference voltage that is coupled to a voltage comparator 12. Voltage comparator 12 compares the reference voltage to the power supply rail Vdd to determine whether or not boosting should be enabled for word lines within a memory array 15. A voltage booster 13 sets word lines to selectively predetermined voltages in conformity with a boost signal received from voltage comparator 12. A decoder 14 provides a decoded row address to select the particular voltage booster 13 and its associated word line.

Memory drive circuitry 10 provides reliable low-voltage operation for memory array 15, permitting the read circuits to operate at voltages below those otherwise possible if the word lines were only driven to the power supply rail, while avoiding power problems when full power supply voltages are available. Voltage drops due to threshold voltages in the gating transistors degrade operation in memory devices that may operate with power supplies lower than two volts. Since the threshold of the gating transistors generally are in the range of 0.6 volts, the use of boosted word lines can improve the swing of the word line inputs to the read electronics by 33% or more.

When a memory addressing subsystem is operated at high power supply voltages, the gate oxide in the gating transistors can be over-stressed if a boost circuit is employed. When a memory cell within a memory array is at a logic low level and the boost circuitry is operating, the entire boosted voltage (as much as twice the supply rail voltage) will appear across the gate-source of the gating transistors, weakening the oxide layer, and reducing the mean-time-before-failure (MTBF) of the gating transistors. Selectable boosting saves power and prevents damage when operating at high voltages, while improving voltage swing and noise margin to the read electronics when operating memory array 15 at low power supply voltages.

Figure 2:
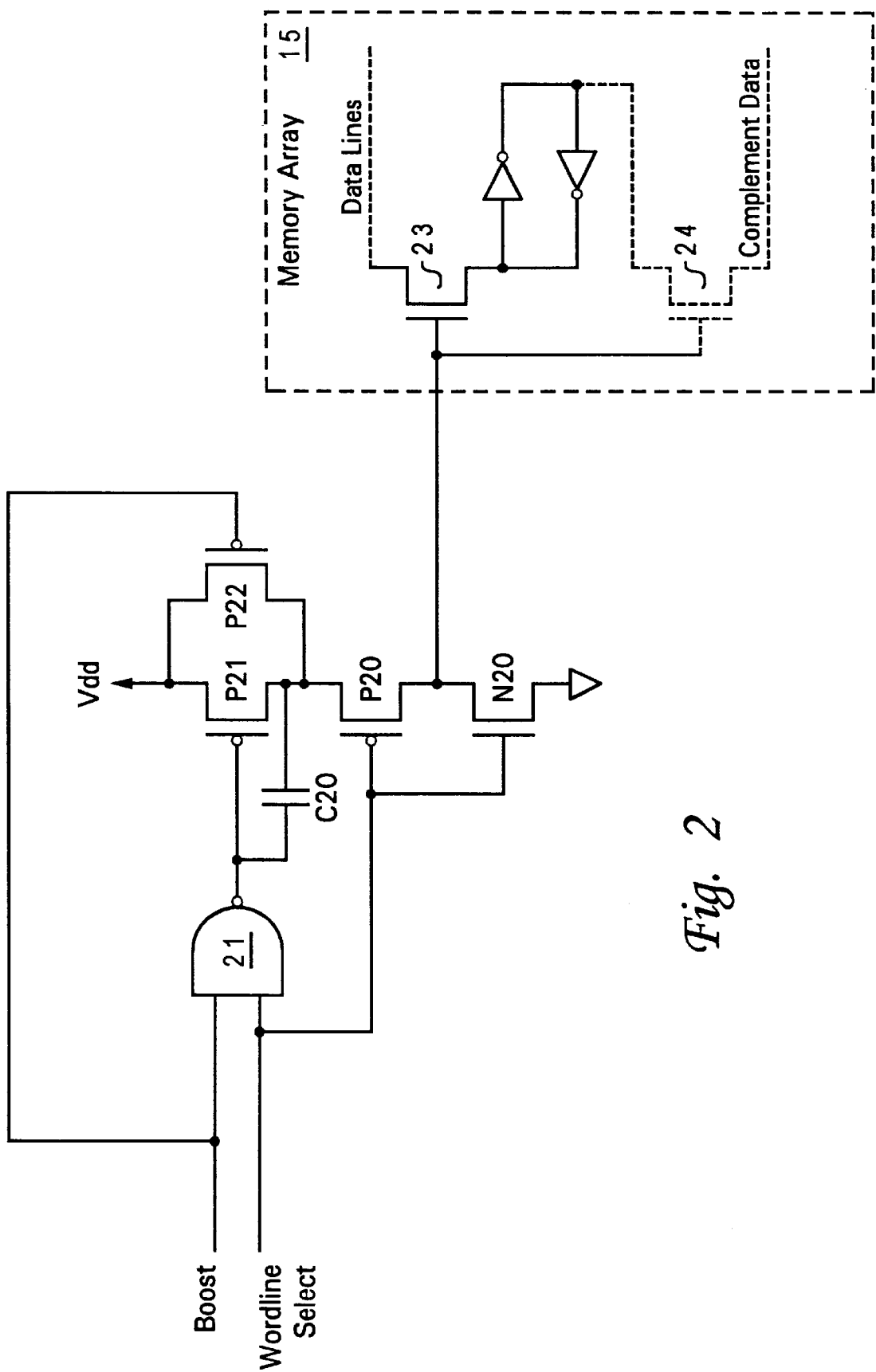
FIG. 2 is a schematic diagram of the memory circuit from FIG. 1 in accordance with a preferred embodiment of the invention.

Referring now to FIG. 2, a schematic diagram of a circuit by which memory drive circuit 10 from FIG. 1 may be applied to address data within a memory array in accordance with a preferred embodiment of the invention is shown. The logic signal Boost and the active-low signal wordline select are coupled to NAND gate 21. When Boost is inactive, the operation of NAND gate 21 is such that the output is a static logic high value. In this state, a transistor P22 is enabled, switching Vdd to transistor P20. When wordline select is lowered, transistor P20 passes the voltage at its source terminal (in this case Vdd) to the word line.

Transistor N20 discharges the word line when wordline select is inactive (high). When Boost is in its active high state, transistor P22 is disabled. Before wordline select is activated (low), the output of NAND gate 21 will be low, enabling transistor P21 to charge the terminal of capacitor C20 coupled to its drain terminal to Vdd. The terminal of capacitor C20 coupled to the output of NAND gate 21 will be held near ground potential. When /word line select is activated (low), the output of NAND gate 21 will rise to Vdd and transistor P21 is disabled. This will cause the voltage at the terminal of capacitor C20 that is coupled to transistor P20 to rise to a higher voltage than Vdd. Without a load, this voltage would be twice Vdd, but the voltage can be tailored to a specific design by the choice of the capacitor C20 value. A low value of capacitance for capacitor C20 can be chosen since for a predetermined word line capacitance, the charge dumped from capacitor C20 onto the fully discharged word line (due to the action of N20), the voltage will increased above Vdd be the ratio of the capacitance of capacitor C20 to the capacitance of capacitor C20 plus the word line capacitance. The steady-state boost voltage may be limited by the capacitance and the threshold voltages of transistor P21 and transistor P22. Threshold voltages with magnitudes less than the difference between Vdd and the maximum boost voltage will cause the boost voltage to be Vdd+ Vtpabs, where Vtpabs is the absolute value of the p-channel threshold voltage of transistor P21.

Transistor P20 is enabled to dump the charge on capacitor C20 to the word line, driving the word line above Vdd. The word line is coupled to memory array 21 enabling gating transistor 23 and optional gating transistor 24 (for complementary data architectures) to conduct the storage cell voltages onto data lines that can be read by read electronics within memory array 21.

Figure 3:
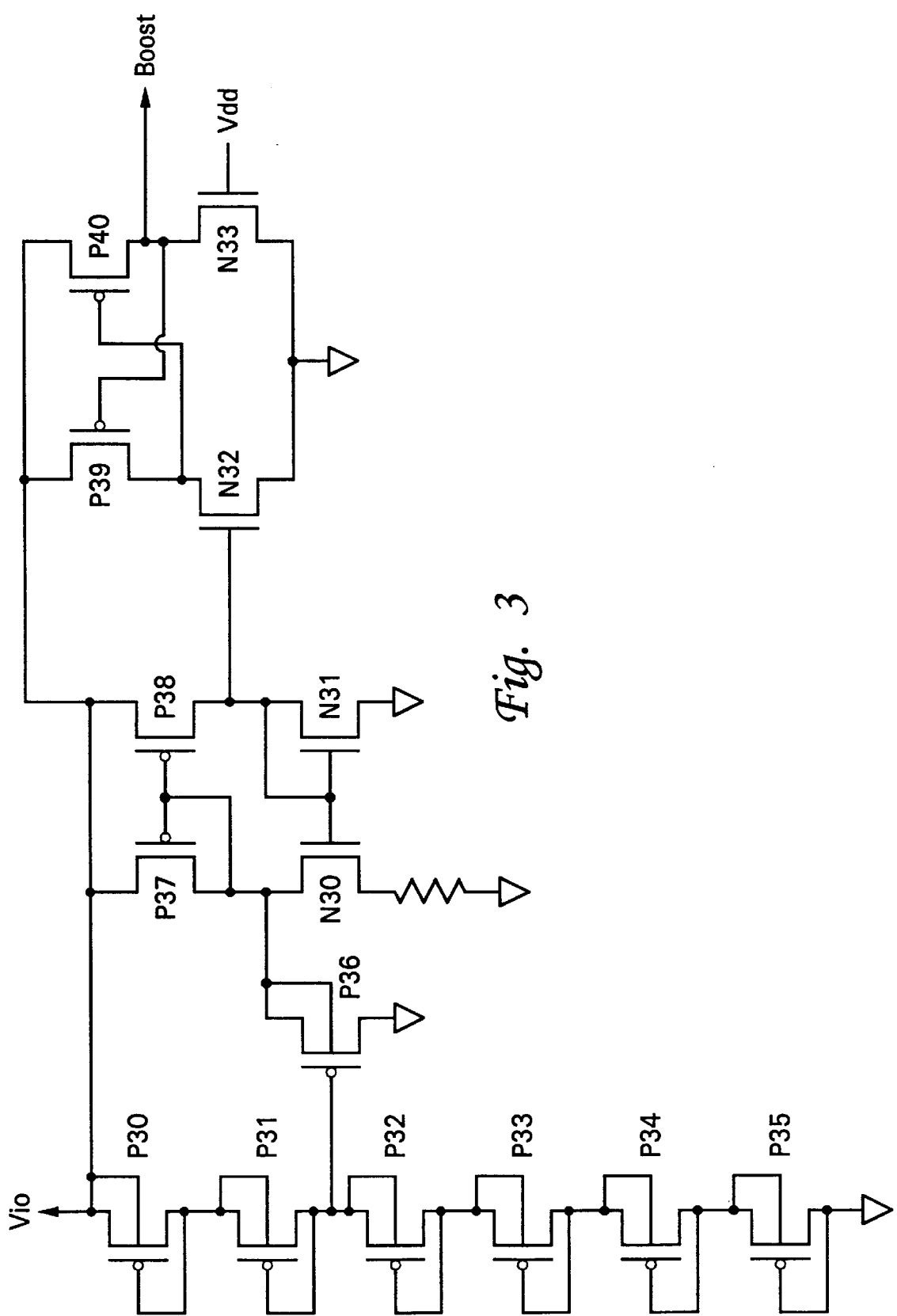
FIG. 3 is a schematic diagram of the reference voltage generator and voltage comparator within the memory circuit of FIG. 1 is depicted.

Referring now to FIG. 3, a detailed schematic of reference voltage generator 11 and voltage comparator 12 within memory 10 of FIG. 1 is depicted. Transistors P30, P31, P32, P33, P34 and P35 form a voltage divider that produces a fraction of Vio to supply a voltage reference. Vio is used as a voltage source for the reference circuits, as headroom above Vdd is necessary for proper operation of the reference and comparator circuits. Vio is a supply voltage higher than Vdd, where Vdd is the common power supply voltage for the memory circuits. For example Vdd may be 1.0V and Vio may be 1.8V. Transistor P36 is a source-follower that buffers the voltage reference output and sinks current from a current mirror formed by transistors P37 and P38. The source-follower ensures that the reference circuit properly starts in a stable conducting state, as there is a non-conducting state of the current mirror that is also stable. The output of reference circuit is coupled to a comparator formed by transistors N32, N33, P39, and P40 that compares the reference voltage to Vdd, creating output signal Boost that determines whether or not voltage boosting will be applied to the memory word lines.

The resistance value of R30, the value of the N-fet threshold voltage, and the relative sizes of N30 and N31 provide selection of the reference voltage for the comparator formed by N32, N33, P39, and P40. The threshold is selected so that noise margin and voltage swing are preserved for the lowest expected memory power supply voltage. The boost circuitry will be disabled for power supply voltages above the reference voltage, reducing stress on the gating transistors.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A memory, comprising:
   a decoder for decoding accesses to word lines within said memory;
   a word line access circuit coupled to a word line select output of said decoder for accessing cells within said memory, wherein said word line access circuit includes a capacitor which is selectively pre-charged; and
   a voltage comparator coupled to said word line access circuit for controlling pre-charge of said capacitor if a power supply voltage is less than a threshold voltage.

2. The memory circuit of claim 1, further comprising a voltage reference coupled to said voltage comparator for determining if said power supply voltage is less than said threshold voltage.

3. The memory circuit of claim 2, wherein said voltage reference comprises a reference threshold circuit.

4. The memory circuit of claim 3, wherein said voltage reference further comprises:
   a voltage divider formed from a plurality of transistors of one transistor type, said transistors coupled between said power supply voltage and ground; and
   a source follower coupled to said voltage divider for buffering an output of said voltage divider and for starting said reference circuit in a conducting state.

5. The memory circuit of claim 1, wherein said word line access circuit further comprises a NAND gate having a first input coupled to a boost output of said voltage comparator, a second input coupled to a word line select output of said decoder and an output coupled to a terminal of said capacitor for controlling pre-charge of said capacitor.

6. The memory circuit of claim 5, wherein said word line access circuit further comprises a transistor coupled from a power supply rail to said word line access circuit, said transistor having a gate coupled to said boost output for supplying a voltage when said boost is not selected.

7. A memory circuit, comprising:
   a decoder for decoding accesses to word lines within said memory;
   a voltage comparator for determining if a power supply voltage of said memory is less than a threshold voltage;
   a logic gate having a first input coupled to an output of said voltage comparator and a second input coupled to said decoder; and
   a capacitor coupled to an output of said logic gate for producing a boosted voltage when said output of said logic gate transitions from a first logic state to a second logic state.

8. The memory circuit of claim 7, further comprising a first transistor having a gate coupled to said output of said logic gate, a source coupled to said capacitor and a drain coupled to said power supply voltage for charging said capacitor to said power supply voltage when said logic gate is in said first logic state.

9. The memory circuit of claim 8, further comprising a second transistor having a drain coupled to said source of said first transistor and a gate coupled to an output of said decoder for dumping a charge of said capacitor to a word line select output when said output of said decoder selects a word line.

10. The memory circuit of claim 9, further comprising a third transistor having a gate coupled to said output of said decoder, a drain coupled to said word line select output and a source coupled to ground for discharging said word line select output when said output of said decoder de-selects said word line.

11. The memory circuit of claim 10, further comprising a fourth transistor having a gate coupled said output of said voltage comparator, a drain coupled to said power supply voltage and a source coupled to said word line select output for charging said word line select output to said power supply voltage when said voltage comparator determines that said power supply voltage is not less than said threshold voltage.

* * * * *

UNITED STATES PATENT AND TRADEMARK OFFICE
CERTIFICATE OF CORRECTION

PATENT NO.    : 6,335,900 B1                                              Page 1 of 1
DATED         : January 1, 2002
INVENTOR(S)   : Kwon et al.

It is certified that error appears in the above-identified patent and that said Letters Patent is hereby corrected as shown below:

<u>Title page,</u>
Item [75], Inventors, please add -- ,Cupertino, CA -- after "Ohsang Kwon";
Please delete "both of" before the word "Austin"
Please change "all of" to before "both of" before the word "TX"

Signed and Sealed this

Third Day of September, 2002

*Attest:*

*Attesting Officer*

JAMES E. ROGAN
*Director of the United States Patent and Trademark Office*